US006275590B1

(12) United States Patent
Prus

(10) Patent No.: US 6,275,590 B1
(45) Date of Patent: Aug. 14, 2001

(54) ENGINE NOISE SIMULATING NOVELTY DEVICE

(76) Inventor: Robert S. Prus, 2630 Vermillion Rd., Seabrook, TX (US) 77586

(*) Notice: Subject to any disclaimer, the term of this patent is extended or adjusted under 35 U.S.C. 154(b) by 0 days.

(21) Appl. No.: 09/156,144

(22) Filed: Sep. 17, 1998

(51) Int. Cl.[7] .................................................... H03G 3/00

(52) U.S. Cl. ............................................. 381/61; 381/86

(58) Field of Search ............................... 381/61, 86, 301, 381/302, 332; 455/345–349; 379/446, 455, 454; 224/483, 929; 248/27.1, 27.3, 905, 904, 225.21, 225.11, 223.41, 224.7

(56) References Cited

U.S. PATENT DOCUMENTS 5,237,617 * 8/1993 Miller ..................................... 381/61
5,371,802 * 12/1994 McDonald et al. .................... 381/61
5,586,187 * 12/1996 Webb ..................................... 381/86
5,661,811 * 8/1997 Huemann et al. ..................... 381/86

* cited by examiner

*Primary Examiner*—Forester W. Isen
*Assistant Examiner*—Laura A. Grier

(57) ABSTRACT

An engine noise simulating novelty device is provided including a speaker for audibly transmitting audio signals upon the receipt thereof. Further included is a sound module connected to the speaker and a tachometer of a vehicle. The sound module is adapted to communicate audio signals with the speaker which represent a sound, wherein a frequency of the sound is varied with a change in the revolutions per minute of the engine of the vehicle, as indicated by the tachometer.

6 Claims, 3 Drawing Sheets

ENGINE NOISE SIMULATING NOVELTY DEVICE

BACKGROUND OF THE INVENTION

1. Field of the Invention

The present invention relates to vehicular sound systems and more particularly pertains to a new engine noise simulating novelty device for simulating sounds of engines of various vehicles.

2. Description of the Prior Art

The use of vehicular sound systems is known in the prior art. More specifically, vehicular sound systems heretofore devised and utilized are known to consist basically of familiar, expected and obvious structural configurations, notwithstanding the myriad of designs encompassed by the crowded prior art which have been developed for the fulfillment of countless objectives and requirements.

Known prior art vehicular sound systems and the like include U.S. Pat. Nos. 4,506,380; 5,371,802; 5,097,923; 4,125,898; 3,158,835; and U.S. Pat. Des. No. 249,689.

In these respects, the engine noise simulating novelty device according to the present invention substantially departs from the conventional concepts and designs of the prior art, and in so doing provides an apparatus primarily developed for the purpose of simulating sounds of engines of various vehicles.

SUMMARY OF THE INVENTION

In view of the foregoing disadvantages inherent in the known types of vehicular sound systems now present in the prior art, the present invention provides a new engine noise simulating novelty device construction wherein the same can be utilized for simulating sounds of engines of various vehicles.

The general purpose of the present invention, which will be described subsequently in greater detail, is to provide a new engine noise simulating novelty device apparatus and method which has many of the advantages of the vehicular sound systems mentioned heretofore and many novel features that result in a new engine noise simulating novelty device which is not anticipated, rendered obvious, suggested, or even implied by any of the prior art vehicular sound systems, either alone or in any combination thereof.

To attain this, the present invention is adapted for use with a stereo system mounted within a vehicle. The stereo system is equipped with at least a pair of speakers for audibly transmitting audio signals upon the receipt thereof. The vehicle further has a tachometer to indicate an amount of revolutions per minute of an engine of the vehicle, as controlled by an acceleration pedal of the vehicle. As shown in FIGS. 1–4, the present invention includes a housing with a rectilinear configuration. Such housing has a square top face, a square bottom face, and a thin periphery formed therebetween. This periphery is defined by a front face, a rear face and a pair of side faces. As shown in FIG. 1, the top face has a pair of laterally spaced J-shaped clips each having an inboard portion mounted on the top face. Each J-shaped clip is equipped with an outboard portion spaced above the inboard portion with a free edge directed rearwardly. The top face further has a recess formed therein in front of the clips for reasons that will soon become apparent. With continuing reference to FIG. 1, a mounting assembly is mounted below a dash of the vehicle. The mounting assembly is equipped with a pair of laterally spaced sleeves for receiving the outboard portions of the clips of the housing. Further, a resilient tongue extends forwardly from the sleeves with a downwardly extending tab. Such tab serves for snappily engaging the recess of the housing to maintain the clips of the housing in engagement with the mounting assembly. As such, the housing is securely mounted to the dash of the vehicle during use. Mounted on the front face of the housing is a speaker for audibly transmitting audio signals upon the receipt thereof. Further, an amplifier is connected to both the speakers of the stereo system and the speaker mounted on the housing. The amplifier amplifies received audio signals and transmits the same to the speakers. As shown in FIGS. 3 & 5, the amplifier has a volume control dial mounted on the front face of the housing for allowing the manual control of the extent to which the audio signals are amplified. As shown in FIGS. 3 & 5, a speaker selection switch is also included which is mounted on the front face of the housing. The speaker selection switch is connected between the amplifier and the speakers for selecting to which speaker the signals are transmitted from the amplifier. Finally, a sound module is positioned with the housing and connected to the amplifier and the tachometer of the vehicle. The sound module further includes a selector dial mounted on the front face of the housing. In use, the sound module serves to transmit audio signals to the amplifier which represent various sounds as selected by the selector dial. A frequency of the sounds is increased with an increase in the revolutions per minute of the engine of the vehicle as indicated by the tachometer. As such, a novelty device is provide which simulates sounds of various engine types.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new engine noise simulating novelty device apparatus and method which has many of the advantages of the vehicular sound systems mentioned heretofore and many novel features that result in a new engine noise simulating novelty device which is not anticipated, rendered obvious, suggested, or even implied by any of the prior art vehicular sound systems, either alone or in any combination thereof.

It is another object of the present invention to provide a new engine noise simulating novelty device which may be easily and efficiently manufactured and marketed.

It is a further object of the present invention to provide a new engine noise simulating novelty device which is of a durable and reliable construction.

An even further object of the present invention is to provide a new engine noise simulating novelty device which is susceptible of a low cost of manufacture with regard to both materials and labor, and which accordingly is then susceptible of low prices of sale to the consuming public, thereby making such engine noise simulating novelty device economically available to the buying public.

Still yet another object of the present invention is to provide a new engine noise simulating novelty device which provides in the apparatuses and methods of the prior art some of the advantages thereof, while simultaneously overcoming some of the disadvantages normally associated therewith.

Still another object of the present invention is to provide a new engine noise simulating novelty device for simulating sounds of engines of various vehicles.

Even still another object of the present invention is to provide a new engine noise simulating novelty device that includes a speaker for audibly transmitting audio signals upon the receipt thereof. Further included is a sound module connected to the speaker and a tachometer of a vehicle. The sound module is adapted to communicate audio signals with the speaker which represent a sound, wherein a frequency of the sound is varied with a change in the revolutions per minute of the engine of the vehicle, as indicated by the tachometer.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
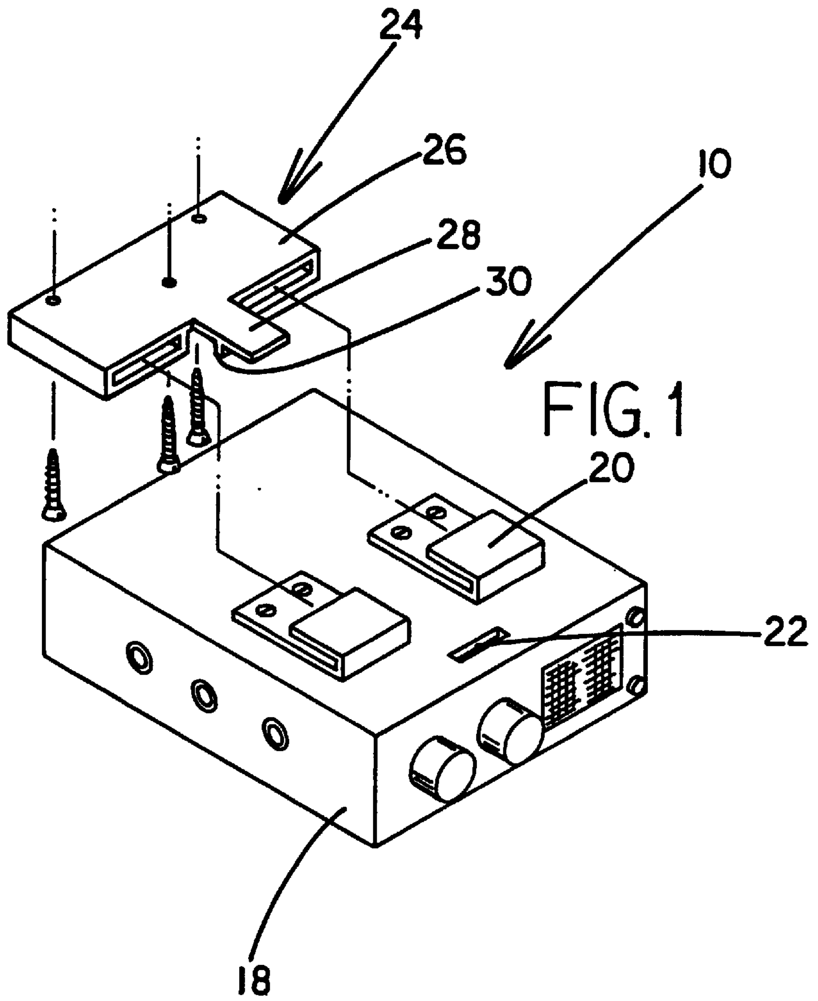
FIG. 1 is a perspective view of a new engine noise simulating novelty device according to the present invention.
Figure 2:
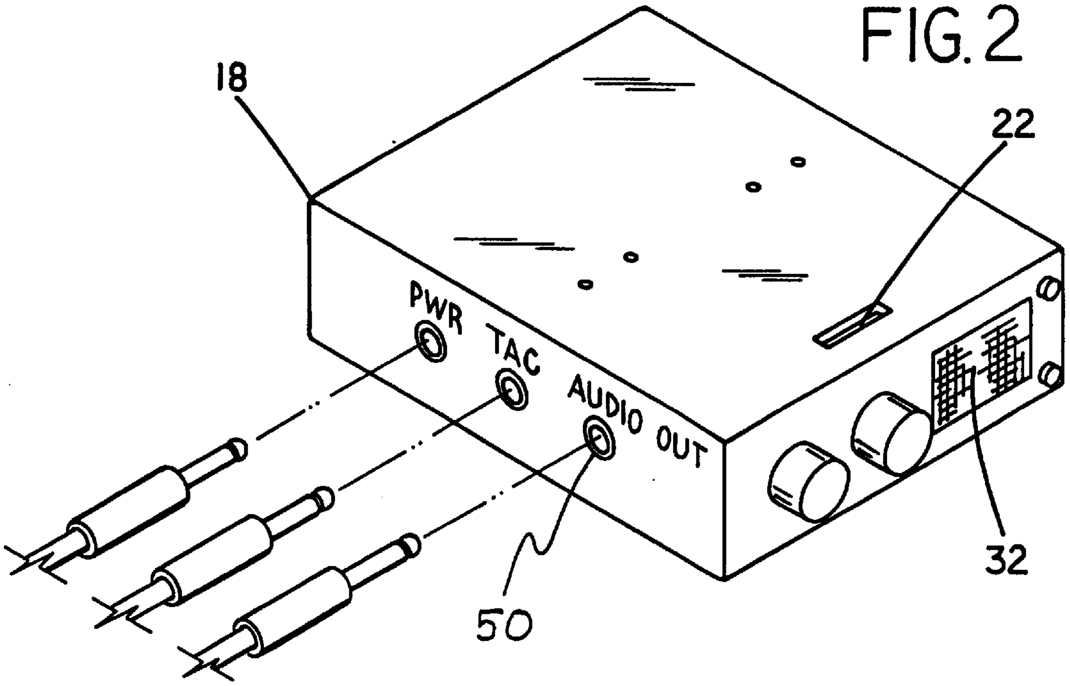
FIG. 2 is a perspective view of the housing of the present invention.

With reference now to the drawings, and in particular to FIGS. 1 through 5 thereof, a new engine noise simulating novelty device embodying the principles and concepts of the present invention and generally designated by the reference numeral 10 will be described.

The present invention, designated as numeral 10, is adapted for use with a stereo system 12 mounted within a vehicle. The stereo system is equipped with at least a pair of speakers 14 for audibly transmitting audio signals upon the receipt thereof. The vehicle further has a tachometer 16 to indicate an amount of revolutions per minute of an engine of the vehicle, as controlled by an acceleration pedal of the vehicle.

As shown in FIGS. 1–4, the present invention includes a housing 18, or box, with a rectilinear configuration. Such housing has a square top face, a square bottom face, and a thin periphery formed therebetween. This periphery is defined by a front face, a rear face and a pair of side faces. As shown in FIG. 1, the top face has a pair of laterally spaced J-shaped clips 20 each having a planar inboard portion mounted on the top face. Each J-shaped clip is equipped with a planar outboard portion spaced above the inboard portion with a free edge directed rearwardly. The top face further has a recess 22 formed therein in front of the clips for reasons that will soon become apparent.

With continuing reference to FIG. 1, a mounting assembly 24 is mounted below a dash of the vehicle. The mounting assembly is equipped with a pair of laterally spaced sleeves 26 for receiving the outboard portions of the clips of the housing. Further, a resilient tongue 28 extends forwardly from the sleeves with a downwardly extending tab 30. Such tab serve s for snappily engaging the recess of the housing to maintain the clips of the housing in engagement with the mounting assembly. As such, the housing is securely mounted to the dash of the vehicle during use.

Figure 3:
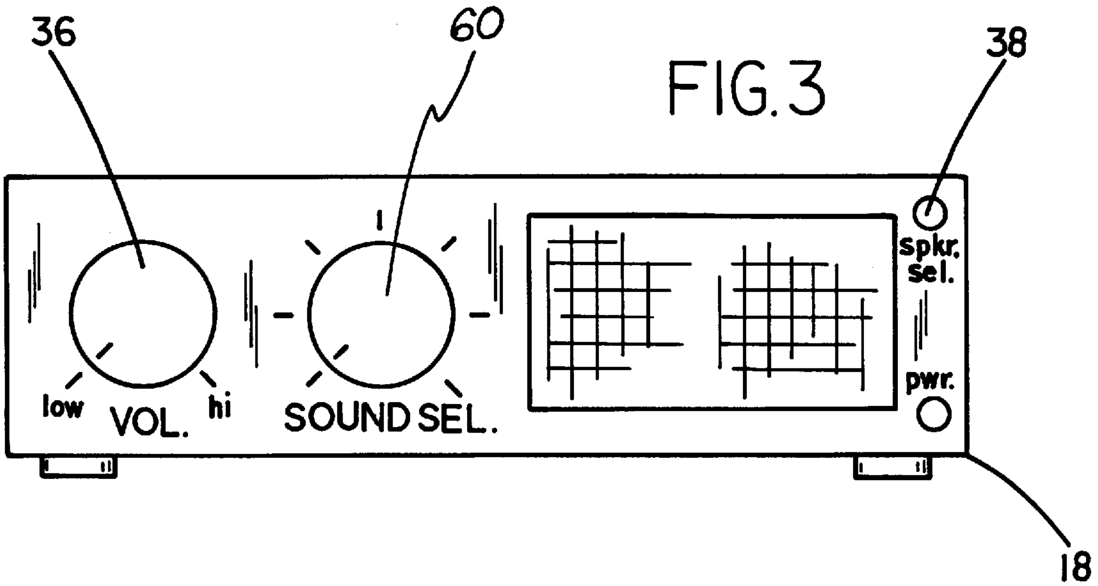
FIG. 3 is a front view of the housing of the present invention showing the various dials and switches thereof.
Figure 4:
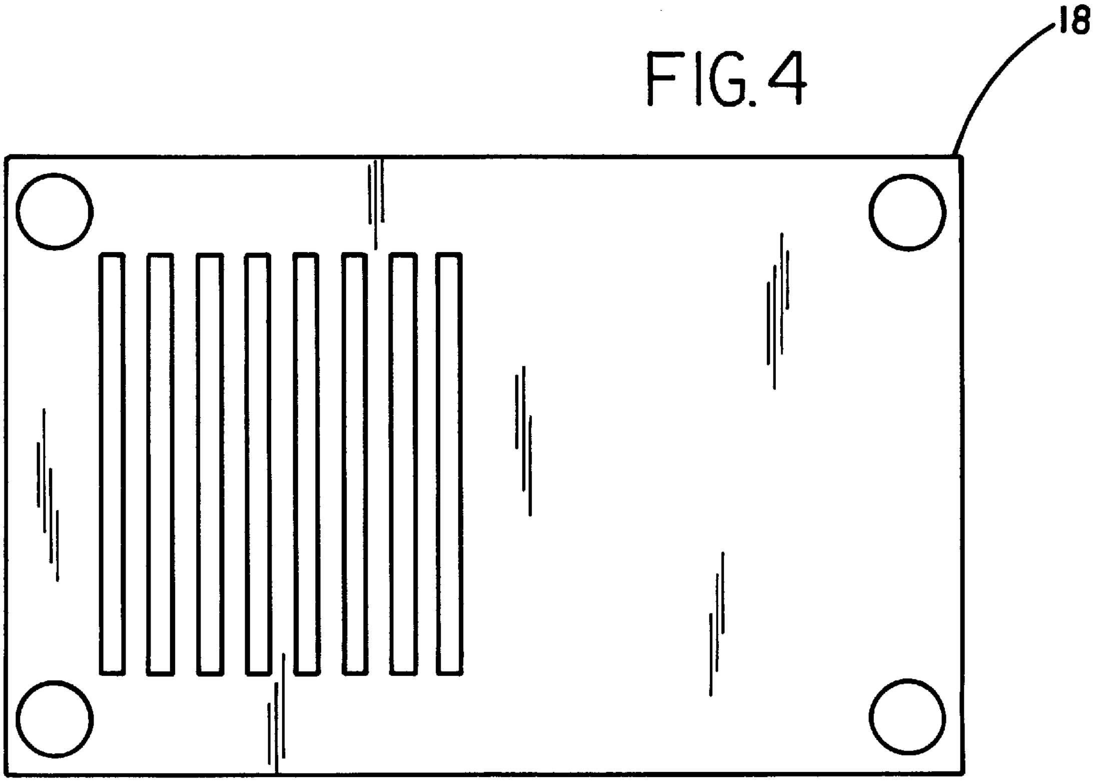
FIG. 4 is a bottom view of the housing of the present invention.
Figure 5:
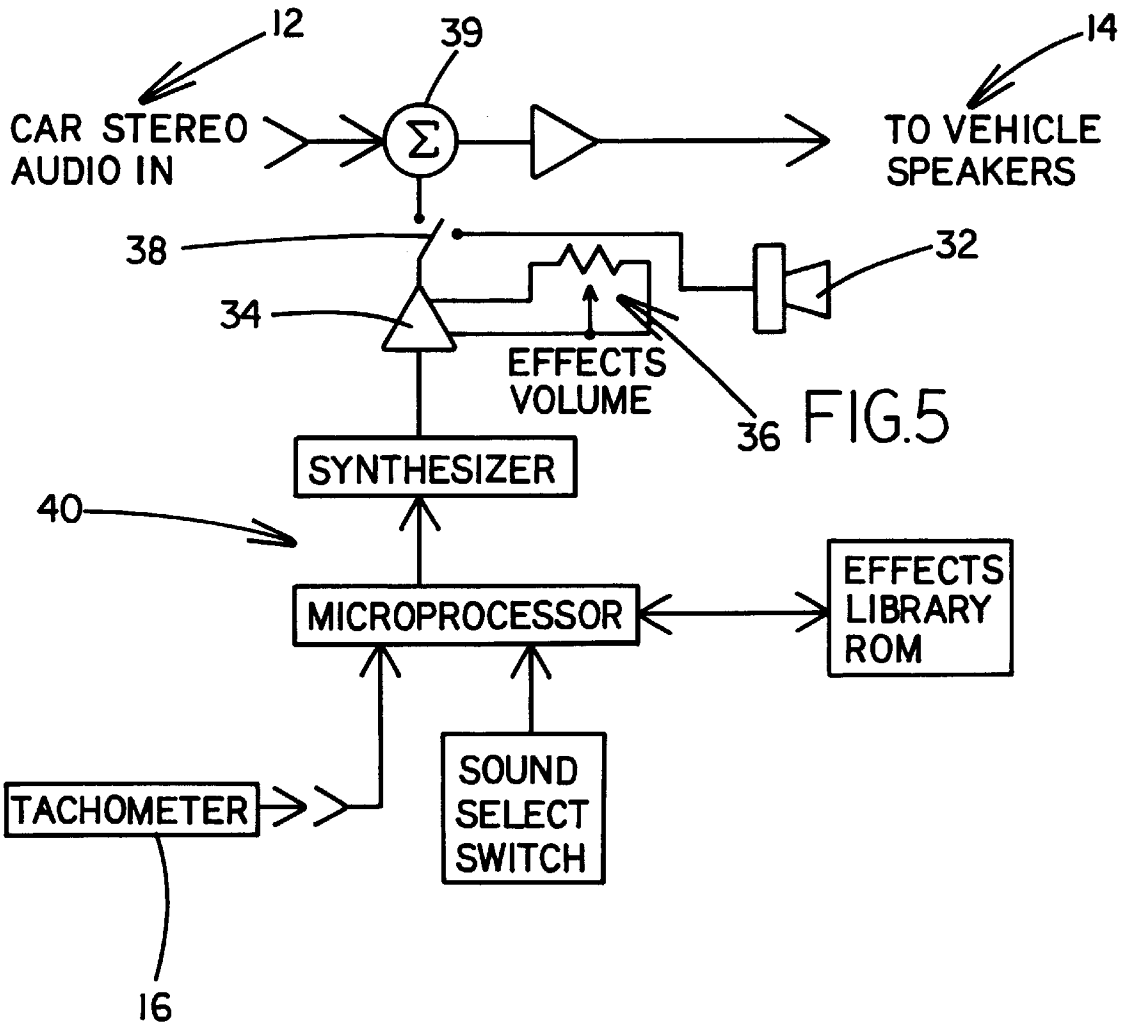
FIG. 5 is a schematic diagram of the present invention.

Mounted on the front face of the housing is a speaker 32 for audibly transmitting audio signals upon the receipt thereof. Further, an amplifier 34 is connected to both the speakers of the stereo system and the speaker mounted on the housing. Connection between the amplifier and the vehicle speaker is preferably accomplished with an input port mounted on one of the side faces of the periphery of the housing. The amplifier amplifies received audio signals and transmits the same to the speakers. As shown in FIGS. 3 & 5, the amplifier has a volume control dial 36 mounted on the front face of the housing for allowing the manual control of the extent to which the audio signals are amplified.

As shown in FIGS. 3 & 5, a speaker selection switch 38 is also included which is mounted on the front face of the housing. The speaker selection switch is connected between the amplifier and the speakers for selecting to which speaker the signals are transmitted from the amplifier. The speaker selection switch may be connected between the vehicle speakers and the vehicle stereo system via a summer 39 such that audio signals generated from the stereo system and the present invention are summed and passed simultaneously when the vehicle speakers of the stereo system are selected. In such embodiment, an additional port is required to receive signals from the stereo system. As an option, the amplifier may be connected directly to the vehicle speakers without the summer. In yet another embodiment, the audio signals from the stereo system may be filtered in favor of those received from the amplifier of the present invention. When the speaker mounted on the housing is selected, however, the vehicle speakers of the stereo system and the speaker of the housing work independently.

Finally, a sound module 40 is positioned with the housing and connected to the amplifier, a battery, and the tachometer of the vehicle. Connection 50 with the battery and the tachometer is preferably accomplished with a plurality of input ports mounted on one of the side faces of the periphery of the housing. Note FIG. 2. The sound module further includes a selector dial 60 mounted on the front face of the housing for reasons that will soon become apparent.

In use, the sound module serves to transmit audio signals to the amplifier which represent various sounds as selected by the selector dial. To accomplish this, the sound module preferably includes a microprocessor with an associated synthesizer and a read only memory look up table, as shown in FIG. 5. A frequency of the sounds is increased with an increase in the revolutions per minute of the engine of the vehicle, as indicated by the tachometer. In other words, the pitch of the sound increases as the revolutions per minute increases. Ideally, the various sounds include the sound of a sports car, pick-up truck, race car, train, space ship, old car and a machine gun. In the case of the machine gun, the frequency refers to the rate at which it fires, not the pitch. This may be accomplished by using an A/D converter connected between the tachometer and the microprocessor such that at each discrete frequency, a corresponding uniquely pitched selected sound is gleaned from the look-up table and amplified accordingly.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. An engine noise simulating novelty device comprising, in combination:

a stereo system mounted within the vehicle with at least a pair of speakers for audibly transmitting audio signals upon the receipt thereof;

a tachometer positioned within the vehicle and adapted to indicate an amount of revolutions per minute of an engine of the vehicle as controlled by an acceleration pedal of the vehicle;

a housing with a rectilinear configuration having a square top face, a square bottom face, and a thin periphery formed therebetween defined by a front face, a rear face and a pair of side faces, the top face having a pair of laterally spaced J-shaped clips each having an inboard portion mounted on the top face with an outboard portion spaced above the inboard portion with a free edge directed rearwardly, the top face further having a recess formed therein in front of the clips;

a mounting assembly mounted below a dash of the vehicle with a pair of laterally spaced sleeves for receiving the outboard portions of the clips of the housing and a resilient tongue extending forwardly from the sleeves with a downwardly extending tab for snappily engaging the recess of the housing to maintain the clips of the housing in engagement with the mounting assembly;

a speaker mounted on the front face of the housing for audibly transmitting audio signals upon the receipt thereof;

an amplifier connected to the speakers of the stereo system and the speaker mounted on the housing for amplifying received audio signals and transmitting the same to the speakers, wherein the amplifier has a volume control dial mounted on the front face of the housing for allowing the manual control of the extent to which the audio signals are amplified;

a speaker selection switch mounted on the front face of the housing and connected between the amplifier and the speakers for selecting to which speaker the signals are transmitted from the amplifier; and a sound module positioned with the housing and connected to the amplifier, the tachometer of the vehicle, and a selector dial mounted on the front face of the housing, the sound module adapted to transmit audio signals to the amplifier which represent various sounds as selected by the selector dial, wherein a frequency of the sounds is increased with an increase in the revolutions per minute of the engine of the vehicle as indicated by the tachometer.

2. An engine noise simulating novelty device comprising:

a tachometer positioned within a vehicle and adapted to indicate an amount of revolutions per minute of an engine of the vehicle;

a speaker for audibly transmitting audio signals upon the receipt thereof;

a sound module connected to the speaker and the tachometer of the vehicle, the sound module adapted to communicate audio signals with the speaker which represent a sound, wherein a parameter of the sound is varied with a change in the revolutions per minute of the engine of the vehicle as indicated by the tachometer;

a housing with a rectilinear configuration having a square top face, a square bottom face, and a thin periphery formed therebetween defined by a front face, a rear face and a pair of side faces;

a pair of laterally spaced J-shaped clips each having an inboard portion mounted on the top face with an outboard portion spaced above the inboard portion with a free edge directed rearwardly, the top face further having a recess formed therein in front of the clips.

3. An engine noise simulating novelty device as set forth in claim 2 wherein the sound module includes a selector switch and is adapted to generate one of a plurality of sounds as selected by the selector switch.

4. An engine noise simulating novelty device as set forth in claim 2 wherein the parameter is frequency which increases with an increase in the revolutions per minute of the engine of the vehicle as indicated by the tachometer.

5. An engine noise simulating novelty device as set forth in claim 2 wherein the sound module is positioned within a housing mounted within the vehicle and the speaker is mounted on the housing and further included is a stereo system mounted within the vehicle with at least a pair of speakers for audibly transmitting audio signals upon the receipt thereof, the housing further having a speaker selection switch mounted thereon for selecting to which speaker the audio signals are transmitted.

6. An engine noise simulating novelty device comprising:

a tachometer positioned within a vehicle and adapted to indicate an amount of revolutions per minute of an engine of the vehicle;

a speaker for audibly transmitting audio signals upon the receipt thereof;

a sound module connected to the speaker and the tachometer of the vehicle, the sound module adapted to communicate audio signals with the speaker which represent a sound, wherein a parameter of the sound is varied with a change in the revolutions per minute of the engine of the vehicle as indicated by the tachometer;

a housing with a rectilinear configuration having a square top face, a square bottom face, and a thin periphery formed therebetween defined by a front face, a rear face and a pair of side faces; and a mounting assembly mounted below a dash of the vehicle with a pair of laterally spaced sleeves for receiving the outboard portions of the clips of the housing and a resilient tongue extending forwardly from the sleeves with a downwardly extending tab for snappily engaging the recess of the housing to maintain the clips of the housing in engagement with the mounting assembly.

* * * * *